US010223273B2

(12) United States Patent
Yang et al.

(10) Patent No.: US 10,223,273 B2
(45) Date of Patent: Mar. 5, 2019

(54) MEMORY ACCESS METHOD, STORAGE-CLASS MEMORY, AND COMPUTER SYSTEM

(71) Applicants: HUAWEI TECHNOLOGIES CO., LTD., Shenzhen, Guangdong (CN); Fudan University, Shanghai (CN)

(72) Inventors: RenHua Yang, Shanghai (CN); Junfeng Zhao, Shenzhen (CN); Wei Yang, Hangzhou (CN); Yuangang Wang, Shenzhen (CN); Yinyin Lin, Shanghai (CN)

(73) Assignees: Huawei Technologies Co., Ltd., Shenzhen (CN); Fudan University, Shanghai (CN)

( * ) Notice: Subject to any disclaimer, the term of this patent is extended or adjusted under 35 U.S.C. 154(b) by 48 days.

(21) Appl. No.: 15/638,582

(22) Filed: Jun. 30, 2017

(65) Prior Publication Data

US 2017/0300419 A1     Oct. 19, 2017

Related U.S. Application Data

(63) Continuation of application No. PCT/CN2015/097961, filed on Dec. 18, 2015.

(30) Foreign Application Priority Data

Dec. 31, 2014   (CN) .......................... 2014 1 0856607

(51) Int. Cl.
*G06F 12/02*   (2006.01)
*G06F 12/0868*   (2016.01)
(Continued)

(52) U.S. Cl.
CPC .......... *G06F 12/0868* (2013.01); *G06F 11/14* (2013.01); *G06F 12/0246* (2013.01);
(Continued)

(58) Field of Classification Search
CPC . G06F 12/0246; G06F 12/0802; G06F 12/109
(Continued)

(56) References Cited

U.S. PATENT DOCUMENTS 5,197,026 A   3/1993   Butler
5,758,056 A   5/1998   Barr
(Continued)

FOREIGN PATENT DOCUMENTS

CN   101828234 A   9/2010
CN   102831087 A   12/2012
(Continued)

OTHER PUBLICATIONS

Jamie Liu et al. RAIDR: Retention-Aware Intelligent DRAM Refresh, IEEE, 2012. total 12 pages.
(Continued)

*Primary Examiner* — Than Nguyen
(74) *Attorney, Agent, or Firm* — Leydig, Voit & Mayer, Ltd.

(57) ABSTRACT

A memory access method, a storage-class memory, and a computer system are provided. The computer system includes a memory controller and a hybrid memory, and the hybrid memory includes a dynamic random access memory (DRAM) and a storage-class memory (SCM). The memory controller sends a first access instruction to the DRAM and the SCM. When determining that a first memory cell set that is of the DRAM and to which a first address in the received first access instruction points includes a memory cell whose retention time is shorter than a refresh cycle of the DRAM, the SCM may obtain a second address having a mapping relationship with the first address. Further, the SCM converts, according to the second address, the first access instruction into a second access instruction for accessing the SCM, to implement access to the SCM.

17 Claims, 5 Drawing Sheets

(51) Int. Cl.
  *G06F 13/28* (2006.01)
  *G06F 11/14* (2006.01)
  *G06F 12/0802* (2016.01)
  *G06F 12/109* (2016.01)
  *G11C 11/406* (2006.01)

(52) U.S. Cl.
  CPC ........ *G06F 12/0802* (2013.01); *G06F 12/109* (2013.01); *G06F 13/28* (2013.01); *G11C 11/40615* (2013.01); *G11C 11/40622* (2013.01); *Y02D 10/13* (2018.01); *Y02D 10/14* (2018.01); *Y02D 10/151* (2018.01)

(58) Field of Classification Search
  USPC .......................................................... 711/170
  See application file for complete search history.

(56) References Cited

U.S. PATENT DOCUMENTS

| | | | |
|---|---|---|---|
| 8,719,537 B2 | 5/2014 | Loh et al. | |
| 2003/0235095 A1 | 12/2003 | Inoue | |
| 2005/0213419 A1 | 9/2005 | Miyamoto | |
| 2010/0211725 A1 | 8/2010 | Nagashima et al. | |
| 2013/0304982 A1 | 11/2013 | Jung et al. | |
| 2014/0025923 A1 | 1/2014 | Klein et al. | |
| 2014/0317460 A1* | 10/2014 | Kleveland | G11C 29/44 714/710 |
| 2015/0193302 A1* | 7/2015 | Hyun | G11C 29/52 714/764 |
| 2016/0118111 A1* | 4/2016 | Hyun | G11C 11/5621 365/185.03 |
| 2017/0177478 A1* | 6/2017 | Qawami | G11C 13/0004 |
| 2018/0081802 A1* | 3/2018 | Luo | G11C 5/025 |

FOREIGN PATENT DOCUMENTS

| | | |
|---|---|---|
| CN | 103426467 A | 12/2013 |
| CN | 103810112 A | 5/2014 |
| CN | 103810126 A | 5/2014 |
| CN | 103811048 A | 5/2014 |
| JP | 2003308691 A | 10/2003 |
| JP | 2009252005 A | 10/2009 |
| WO | 2011081232 A1 | 7/2011 |
| WO | 2013100936 A1 | 7/2013 |

OTHER PUBLICATIONS

Yeonseung Ryu et al. A Buffer Management Scheme for Mobile Computers with Hybrid Main Memory and Flash Memory Storages. International Journal of Multimedia and Ubiquitous Engineering vol. 7, No. 2, Apr. 2012. total 6 pages.

Gaurav Dhiman et al. PDRAM: A Hybrid PRAM and DRAM Main Memory System, DAC '09, Jul. 26-31, 2009. total 6 pages.

Moinuddin K. Qureshi et al. Scalable High Performance Main Memory System Using Phase-Change Memory Technology. ISCA'09, Jun. 20-24, 2009. total 10 pages.

Benjamin C. Lee et al. Architecting Phase Change Memory as a Scalable DRAM Alternative. ISCA'09, Jun. 20-24, 2009. total 12 pages.

Jing Li et al. 1 Mb 0.41 $\mu m^2$ 2T-2R Cell Nonvolatile TCAM With Two-Bit Encoding and Clocked Self-Referenced Sensing. IEEE Journal of Solid-State Circuits, vol. 49, No. 4, Apr. 2014. total 12 pages.

* cited by examiner

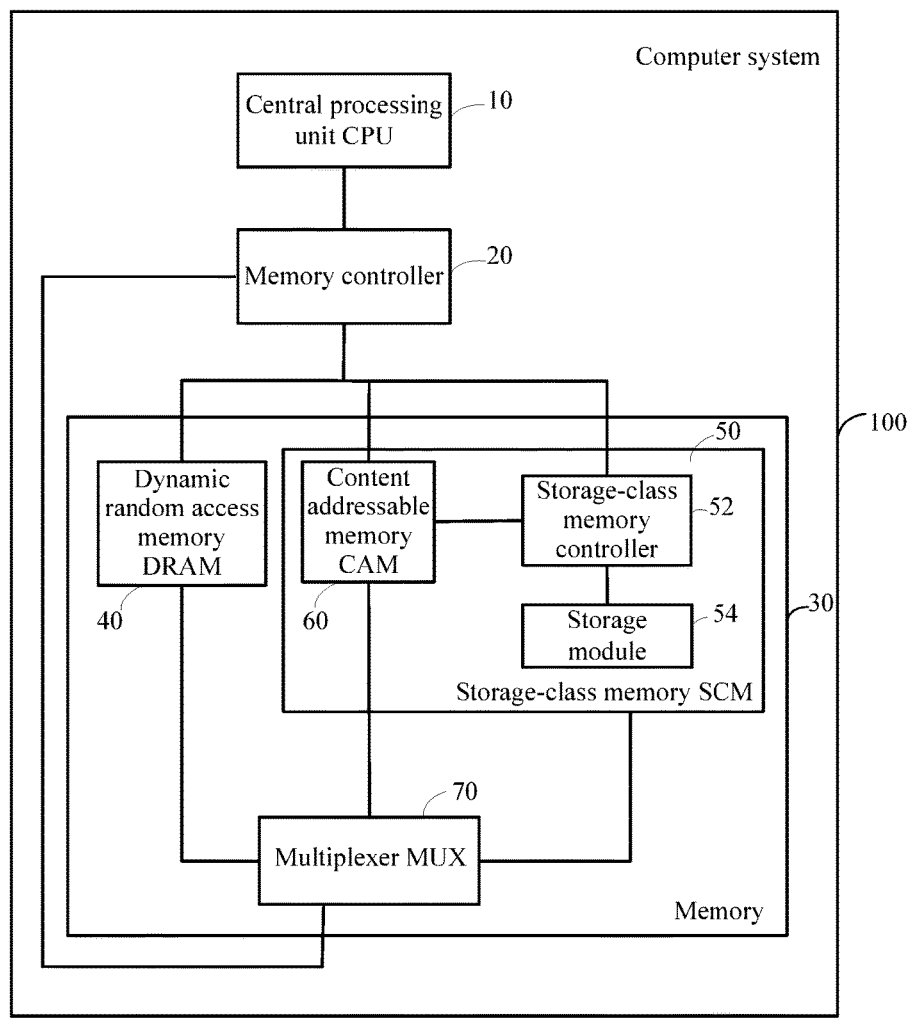
FIG. 1-A

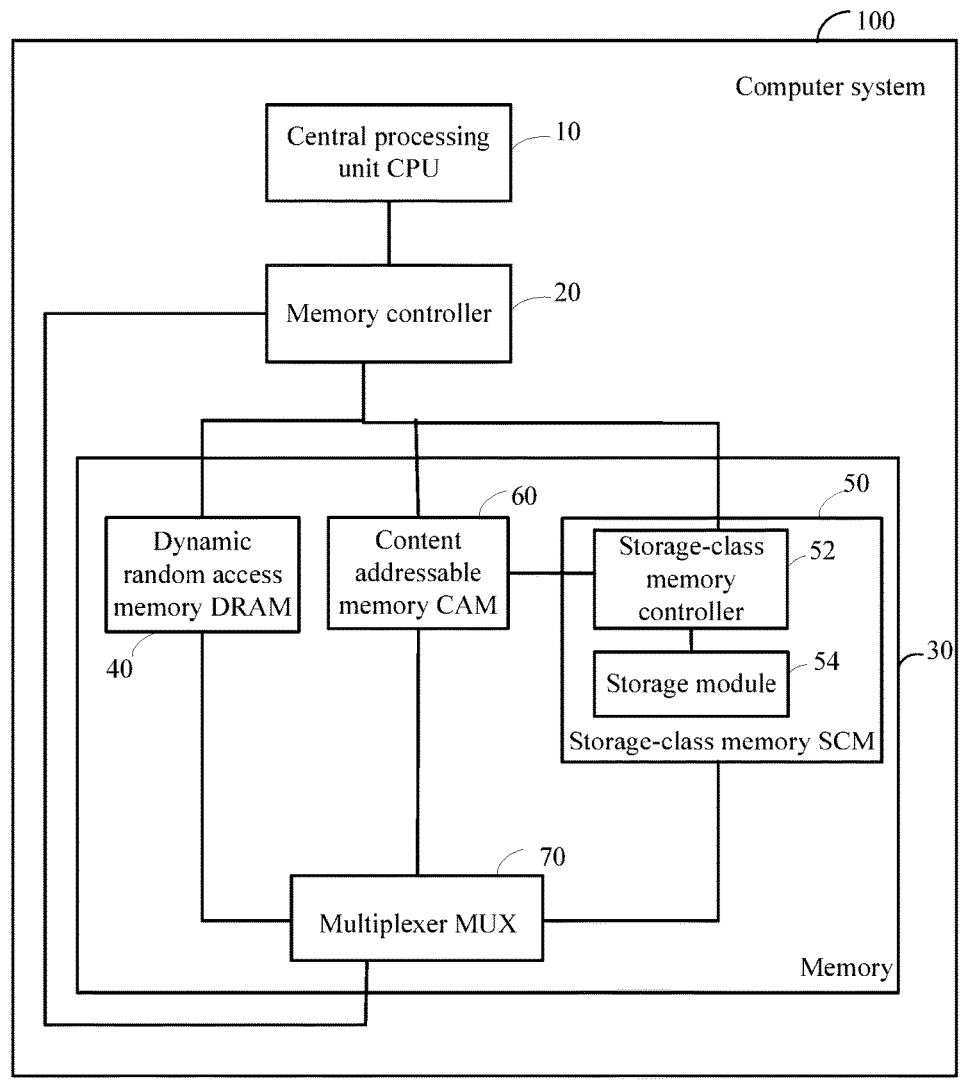
FIG. 1-B

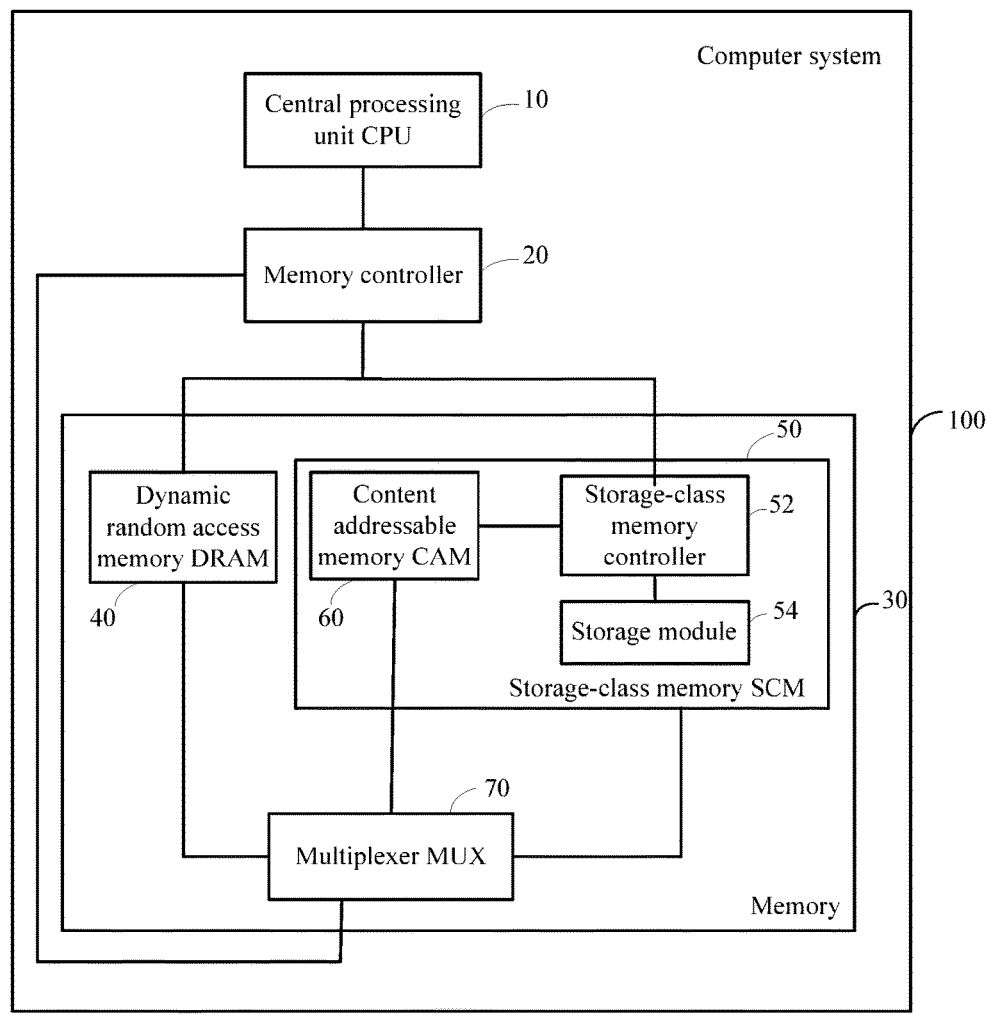
FIG. 1-C

MEMORY ACCESS METHOD, STORAGE-CLASS MEMORY, AND COMPUTER SYSTEM

CROSS-REFERENCE TO RELATED APPLICATIONS

This application is a continuation of International Application No. PCT/CN2015/097961, filed on Dec. 18, 2015, which claims priority to Chinese Patent Application No. 201410856607.X, filed on Dec. 31, 2014. The disclosures of the aforementioned applications are hereby incorporated by reference in their entireties.

TECHNICAL FIELD

The present disclosure relates to the field of computer technologies, and in particular, to a memory access method, a storage-class memory, and a computer system.

BACKGROUND

A conventional main memory of a system generally includes a dynamic random access memory (DRAM). The DRAM is characterized by a simple structure and a high read speed. A basic memory cell of the DRAM is a DRAM cell, and each DRAM cell includes one transistor and one capacitor. The DRAM cell uses an amount of electricity stored in the capacitor to indicate 0 or 1. In this manner, one DRAM cell may store one bit. Because a capacitor is subject to electricity leakage, if electric charges in the capacitor are insufficient, stored data may suffer an error. Therefore, in an actual application, a capacitor needs to be charged periodically. By charging and discharging a capacitor, a DRAM cell can be read and written and thus be updated. In other words, the DRAM is periodically refreshed. In an actual application, DRAM cells in a DRAM are arranged and distributed into a matrix, and the matrix is referred to as a DRAM bank. Using corresponding row and column decoders, any bit in the DRAM bank can be located. Multiple DRAM banks may constitute one DRAM chip, multiple DRAM chips may constitute one DRAM rank, and multiple DRAM ranks may be further integrated into one dual in-line memory module (DIMM).

The Joint Electron Device Engineering Council (JEDEC) is a standardization organization in the solid-state and semiconductor industry. According to a memory-related standard released by the JEDEC, a DRAM is required to refresh every line at least once in 64 ms. In other words, a refresh cycle of the DRAM specified by the JEDEC is 64 ms. Therefore, currently, DRAMs are almost all manufactured in accordance with the refresh-per-64 ms standard that ensures no data loss. In an actual application, a DRAM controller is required to send a refresh instruction every 7.8 µs, and each instruction is responsible for refreshing one line or multiple lines in a DRAM bank, so as to ensure that all lines in a DRAM are refreshed in 64 ms. As a capacity of the DRAM grows and a quantity of lines increases, a quantity of lines that need to be refreshed by each refresh operation increases accordingly, and consequently, system power consumption also becomes higher. Therefore, as the capacity of the DRAM grows constantly, lowering a refresh frequency of the DRAM is crucial to reducing system power consumption. However, if a refresh cycle of the DRAM is lengthened for reducing system power consumption, an error may be caused to data in the memory.

SUMMARY

Embodiments of the present disclosure provide a memory access method, a storage-class memory, and a computer system, which can ensure correctness of data in a memory while reducing system power consumption.

According to a first aspect, an embodiment of the present disclosure provides a computer system, where the computer system includes a memory controller and a hybrid memory, where the hybrid memory includes a dynamic random access memory DRAM and a storage-class memory SCM, where the memory controller is configured to send a first access instruction to the DRAM and the SCM, where the first access instruction carries a first address, and the first address is used to point to a to-be-accessed first memory cell set of the DRAM;

the DRAM is configured to access a memory cell in the first memory cell set according to the first access instruction; and the SCM is configured to:

receive the first access instruction sent by the memory controller;

determine that the first memory cell set includes a memory cell whose retention time is shorter than a refresh cycle of the DRAM, where the refresh cycle of the DRAM is longer than a standard refresh cycle;

obtain a second address having a mapping relationship with the first address, where the second address is used to point to a second memory cell set of the SCM;

convert the first access instruction into a second access instruction according to the second address, where the second access instruction includes the second address; and access a memory cell in the second memory cell set according to the second access instruction.

With reference to the first aspect, in a first possible implementation manner of the first aspect, the SCM is specifically configured to:

determine, according to the first address stored in a content addressable memory CAM, that the first memory cell set includes a memory cell whose retention time is shorter than the refresh cycle of the DRAM, where the CAM stores an address of a memory cell that is in the DRAM and whose retention time is shorter than the refresh cycle of the DRAM, inclusive of the first address; and obtain, according to the first address and a mapping relationship stored in the CAM between the first address and the second address, the second address having a mapping relationship with the first address, where the memory cell in the first memory cell set that is of the DRAM and to which the first address points and the memory cell in the second memory cell set that is of the SCM and to which the second address points are configured to store same data.

With reference to the first aspect or the first possible implementation manner of the first aspect, in a second possible implementation manner of the first aspect, the memory controller is further configured to send a third access instruction to the DRAM and the SCM, where the third access instruction carries a third address, and the third address is used to point to a to-be-accessed third memory cell set of the DRAM;

the DRAM is further configured to access a memory cell in the third memory cell set according to the third access instruction; and the SCM is further configured to:

receive the third access instruction sent by the memory controller;

determine that the third memory cell set does not include a memory cell whose retention time is shorter than the refresh cycle of the DRAM; and delete the third access instruction.

With reference to the second possible implementation manner of the first aspect, in a third possible implementation manner of the first aspect, the hybrid memory further includes:

a multiplexer MUX, configured to: when the first access instruction is a read instruction, output, to the memory controller, data stored in the memory cell in the second memory cell set of the SCM; or when the third access instruction is a read instruction, output, to the memory controller, data stored in the memory cell in the third memory cell set of the DRAM.

According to a second aspect, an embodiment of the present disclosure provides a storage-class memory SCM, where the SCM is applied to a computer system including a hybrid memory, where the hybrid memory includes a dynamic random access memory DRAM and the SCM, and the SCM includes:

an SCM controller, configured to receive a first access instruction sent by a memory controller of the computer system, where the first access instruction carries a first address, and the first address is used to point to a to-be-accessed first memory cell set of the DRAM; and a content addressable memory CAM, configured to determine that the first memory cell set includes a memory cell whose retention time is shorter than a refresh cycle of the DRAM, and obtain a second address having a mapping relationship with the first address, where the refresh cycle of the DRAM is longer than a standard refresh cycle, and the second address is used to point to a second memory cell set of the SCM, where the SCM controller is further configured to convert the first access instruction into a second access instruction according to the second address, and access a memory cell in the second memory cell set according to the second access instruction, where the second access instruction includes the second address; and memory cells, configured to store data.

With reference to the second aspect, in a first possible implementation manner of the second aspect, the CAM is specifically configured to:

determine, according to the first address prestored in the CAM, that the first memory cell set includes a memory cell whose retention time is shorter than the refresh cycle of the DRAM, where the CAM stores an address of a memory cell that is in the DRAM and whose retention time is shorter than the refresh cycle of the DRAM, inclusive of the first address; and obtain, according to the first address and a mapping relationship stored in the CAM between the first address and the second address, the second address having a mapping relationship with the first address, where a memory cell in the first memory cell set that is of the DRAM and to which the first address points and the memory cell in the second memory cell set that is of the SCM and to which the second address points are configured to store same data.

With reference to the second aspect or the first possible implementation manner of the second aspect, in a second possible implementation manner of the second aspect, the SCM controller is further configured to receive a third access instruction sent by the memory controller, where the third access instruction carries a third address, and the third address is used to point to a to-be-accessed third memory cell set of the DRAM;

the CAM is further configured to determine, according to the third address, that the third memory cell set does not include a memory cell whose retention time is shorter than the refresh cycle of the DRAM; and the SCM controller is further configured to delete the third access instruction.

With reference to the second possible implementation manner of the second aspect, in a third possible implementation manner of the second aspect, the hybrid memory further includes a multiplexer MUX, and the CAM is further configured to:

when the first access instruction is a read instruction, after it is determined that the first memory cell set includes a memory cell whose retention time is shorter than the refresh cycle of the DRAM, send a first instruction signal to the MUX in the hybrid memory, where the first instruction signal is used to instruct the MUX to output data stored in the SCM to the memory controller.

According to a third aspect, an embodiment of the present disclosure provides a memory access method, where the method is applied to a computer system including a hybrid memory, where the hybrid memory includes a dynamic random access memory DRAM and a storage-class memory SCM, the method is executed by the SCM, and the method includes:

receiving a first access instruction sent by a memory controller of the computer system, where the first access instruction carries a first address, and the first address is used to point to a to-be-accessed first memory cell set of the DRAM;

determining that the first memory cell set includes a memory cell whose retention time is shorter than a refresh cycle of the DRAM, where the refresh cycle of the DRAM is longer than a standard refresh cycle;

obtaining a second address having a mapping relationship with the first address, where the second address is used to point to a second memory cell set of the SCM;

converting the first access instruction into a second access instruction according to the second address, where the second access instruction includes the second address; and accessing a memory cell in the second memory cell set according to the second access instruction.

With reference to the third aspect, in a first possible implementation manner of the third aspect, the determining that the first memory cell set includes a memory cell whose retention time is shorter than a refresh cycle of the DRAM includes:

determining, according to the first address stored in a content addressable memory CAM, that the first memory cell set includes a memory cell whose retention time is shorter than the refresh cycle of the DRAM, where the CAM stores an address of a memory cell that is in the DRAM and whose retention time is shorter than the refresh cycle of the DRAM, inclusive of the first address.

With reference to the first possible implementation manner of the third aspect, in a second possible implementation manner of the third aspect, the obtaining a second address having a mapping relationship with the first address includes:

obtaining, according to a mapping relationship, stored in the CAM, between the first address and the second address, the second address having a mapping relationship with the first address, where a memory cell in the first memory cell set that is of the DRAM and to which the first address points and the memory cell in the second memory cell set that is of the SCM and to which the second address points are configured to store same data.

With reference to the third aspect, in a third possible implementation manner of the third aspect, the method further includes:

receiving a third access instruction sent by the memory controller, where the third access instruction carries a third address, and the third address is used to point to a to-be-accessed third memory cell set of the DRAM;

determining that the third memory cell set does not include a memory cell whose retention time is shorter than the refresh cycle of the DRAM; and deleting the third access instruction.

With reference to the third aspect, in a fourth possible implementation manner of the third aspect, the method further includes:

when the first access instruction is a read instruction, after it is determined that the first memory cell set includes a memory cell whose retention time is shorter than the refresh cycle of the DRAM, sending a first instruction signal to a multiplexer MUX in the hybrid memory, where the first instruction signal is used to instruct the MUX to output data stored in the SCM to the memory controller.

According to a fourth aspect, an embodiment of the present disclosure provides a computer program product, including a computer readable storage medium that stores program code, where an instruction included in the program code is used to execute the method according to the third aspect.

In the computer system provided in the embodiments of the present disclosure, a dynamic random access memory DRAM and a storage-class memory SCM together constitute a hybrid memory of the computer system, and a refresh cycle of the DRAM is longer than a standard refresh cycle. When determining that a first memory cell set that is of the DRAM and to which a first address in a received first access instruction points includes a memory cell whose retention time is shorter than the refresh cycle of the DRAM, the SCM may obtain a second address having a mapping relationship with the first address. Further, the SCM converts, according to the second address, the first access instruction into a second access instruction for accessing the SCM, to implement access to the SCM. The computer system provided in the embodiments of the present disclosure can ensure correctness of data while reducing power consumption for DRAM refresh.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure.

FIG. 1-A is a schematic diagram of a computer system architecture based on a hybrid memory according to an embodiment of the present disclosure;

FIG. 1-B is a schematic diagram of another computer system architecture based on a hybrid memory according to an embodiment of the present disclosure;

FIG. 1-C is a schematic diagram of still another computer system architecture based on a hybrid memory according to an embodiment of the present disclosure;

DESCRIPTION OF EMBODIMENTS

Figure 2:
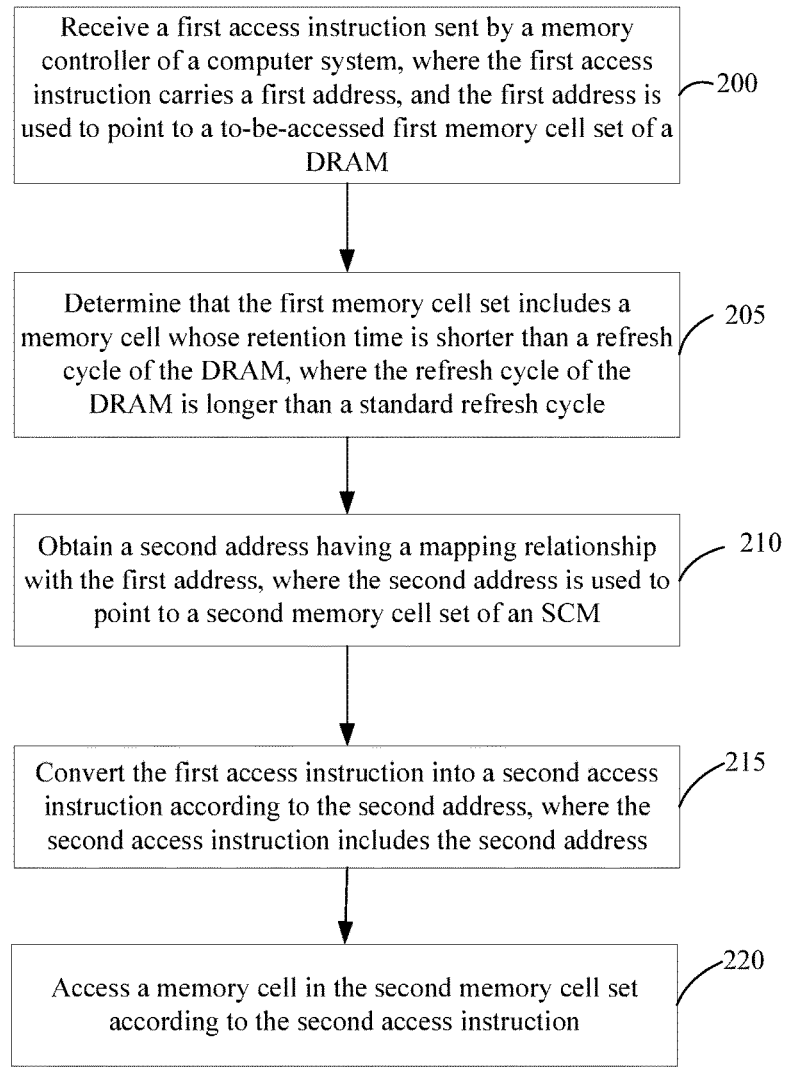
FIG. 2 is a schematic flowchart of a memory access method according to an embodiment of the present disclosure.

To make a person skilled in the art understand the technical solutions in the present disclosure better, the following clearly describes the technical solutions in the embodiments of the present disclosure with reference to the accompanying drawings in the embodiments of the present disclosure. Apparently, the described embodiments are merely a part rather than all of the embodiments of the present disclosure.

An embodiment of the present disclosure provides, based on a system architecture with a hybrid memory, a memory access method, which can ensure correctness of data stored in a memory while reducing power consumption for memory refresh. FIG. 1-A, FIG. 1-B, and FIG. 1-C are schematic diagrams of computer system architectures based on a hybrid memory according to this embodiment of the present disclosure. In the computer system architectures shown in FIG. 1-A, FIG. 1-B, and FIG. 1-C, a dynamic random access memory DRAM and a storage-class memory (SCM) are viewed as a whole, and together treated as a main memory of a computer system 100. Because the computer system architectures shown in FIG. 1-A, FIG. 1-B, and FIG. 1-C are similar, the following describes the computer system 100 provided in this embodiment of the present disclosure in detail, by mainly referring to FIG. 1-A.

As shown in FIG. 1-A, a central processing unit (CPU) 10 is a computing core and a control core of the computer system 100. The CPU 10 may be an ultra-large-scale integrated circuit. An operating system and another software program are installed in the CPU 10, so that the CPU 10 is capable of accessing a memory, a cache, and a magnetic disk. It can be understood that, in this embodiment of the present disclosure, the CPU 10 is merely an example of a processor. In addition to the CPU 10, the processor may alternatively be another application-specific integrated circuit (ASIC), or be configured as one or multiple integrated circuits that implement this embodiment of the present disclosure. The CPU 10 may include a memory management unit (MMU), and the MMU is configured to implement translation from a logical address into a physical memory address.

A memory controller 20 is a bus circuit controller, inside the computer system 100, that controls a memory 30 and that is configured to manage and plan a rate of data transmission from the memory 30 to the CPU 10. Using the memory controller 20, the memory 30 and the CPU 10 may exchange data. The memory controller 20 may be one independent chip and is connected to the CPU 10 using a system bus. A person skilled in the art may know that the memory controller 20 may also be integrated into a related large chip. For example, the memory controller 20 may be integrated into a microprocessor (for example, the CPU 10) or be built in a northbridge. A specific location of the memory controller 20 is not limited in this embodiment of the present disclosure. For ease of description, in the system architecture shown in FIG. 1-A, an example in which the memory controller 20 is independently configured is used for description. The memory controller 20 controls necessary logic to write data to the memory 30 or read data from the memory 30.

The memory 30 is a main memory of the computer system 100. The memory 30 is generally configured to store various software being running on the operating system, input and output data, information exchanged with an external memory, and the like. To increase an access speed of the CPU 10, the memory 30 needs to possess an advantage of fast access. In a conventional computer system architecture, a dynamic random access memory (DRAM) is generally used as the memory 30. As storage-class memories (SCM) develop, the SCM is also gradually used as a memory owing to characteristics of fast access and non-volatility.

As shown in FIG. 1-A, in the system architecture with a hybrid memory shown in FIG. 1-A, the memory 30 may include a dynamic random access memory (DRAM) 40 and a storage-class memory (SCM) 50. The CPU 10 can access the DRAM 40 and the SCM 50 at a high speed using the memory controller 20, and perform a read operation or a write operation on any memory cell in the DRAM 40 or the SCM 50.

As described above, the DRAM 40 uses an amount of electricity stored in a capacitor to indicate 0 or 1. Because a capacitor is subject to electricity leakage, if electric charges in the capacitor are insufficient, stored data may suffer an error. Therefore, the memory controller 20 refreshes data in the DRAM 40 at regular intervals, to prevent the DRAM 40 from losing data. In addition, the DRAM 40 is volatile. When the computer system 100 is powered off, information in the DRAM 40 is absent from storage. The DRAM 40 may include multiple DRAM chips. In an actual application, the DRAM 40 may exist in a form of a dual in-line memory module (DIMM).

The SCM 50 is a new-generation non-volatile memory. The SCM 50 has an access speed comparable to an access speed of a conventional memory (for example, the DRAM 40), and is further characterized by reliability of a semiconductor product. Moreover, when data is written, the data can be written to the SCM 50 directly without previous data in the SCM 50 erased. The SCM 50 includes a next-generation non-volatile memory (NVM) representative of a phase change memory (PCM), a resistive random access memory (RRAM), a magnetic random access memory (MRAM), a ferroelectric random access memory (FRAM), or the like. A next-generation NVM is characterized by fast access and is addressable by byte, with data written into the non-volatile memory in units of bits. Therefore, the SCM 50 can be mounted to a memory bus, and used as a memory for direct access by the CPU 10. Different from a conventional DRAM, the SCM 50 is non-volatile. When the computer system 100 is powered off, information in the SCM 50 still exists.

The SCM 50 may include a storage-class memory SCM controller 52 and a storage module 54. The SCM controller 52 is configured to access the storage module 54, manage data stored in the storage module 54, or the like. For example, the SCM controller 52 may access the storage module 54 according to a received memory access instruction forwarded by the memory controller 20, to write data to the storage module 54 or read data from the storage module 54. In addition, the SCM controller 52 may be further configured to control a time sequence of data written to the storage module 54, and so on. The SCM controller 52 may include a control circuit, a central processing unit CPU, and an application-specific integrated circuit (ASIC), or be configured as one or more integrated circuits that implement this embodiment of the present disclosure.

The storage module 54 is configured to store data. The storage module 54 may include multiple memory cells. For example, the storage module 54 may be a storage array including multiple memory cells. In this embodiment of the present disclosure, the memory cells in the storage module 54 refer to a smallest memory cell used for storing data. A memory cell is also a smallest unit constituting a storage array. Generally, one memory cell can store 1 bit of data. Certainly, some memory cells can implement multi-valued storage. For memory cells that can implement multi-valued storage, one memory cell may alternatively store 2 bits of data. A specific quantity of bits of data stored in a memory cell is not limited herein. In this embodiment of the present disclosure, the memory cells in the storage module 54 may include next-generation new-type non-volatile memory cells such as phase change memory cells, magnetic memory cells, or resistive memory cells.

In this embodiment of the present disclosure, for ease of description, an energy overhead caused by read operations and write operations on the DRAM 40 or the SCM 50 is referred to as dynamic power consumption, and an energy overhead caused during a period of no read operation or write operation on the DRAM 40 or the SCM 50 is referred to as static power consumption. An energy overhead caused by a read operation on the SCM 50 is comparable to an energy overhead caused by a read operation on the DRAM 40, while an energy overhead caused by a write operation on the SCM 50 is far greater than an energy overhead caused by a write operation on the DRAM 40. Therefore, dynamic power consumption of the SCM 50 is greater than dynamic power consumption of the DRAM 40. However, the DRAM 40 needs to be refreshed but the SCM 50 does not need to be refreshed. Therefore, static power consumption of the DRAM 40 is greater than static power consumption of the SCM 50. In an actual application, if the memory 30 includes only SCMs 50 or includes a large quantity of SCMs 50, an excessively high dynamic power consumption of the system is caused, and system costs are also relatively high. To reduce system power consumption and system costs, in the computer system 100 described in this embodiment of the present disclosure, a quantity of DRAMs 40 used in the memory 30 is greater than a quantity of SCMs 50 used in the memory 30. In this way, a capacity of the DRAM 40 is greater than a capacity of the SCM 50. For example, in the memory 30, a ratio of the quantity of used DRAMs 40 to the quantity of used SCMs 50 may be 10:1, 20:1, or the like. A specific ratio of the quantity of used DRAMs 40 to the quantity of used SCMs 50 is not limited in this embodiment of the present disclosure, provided that the quantity of used DRAMs 40 is greater than the quantity of used SCMs 50. In an actual application, the DRAM 40 may be used in conjunction with the SCM 50 according to an actual requirement. The capacity of the DRAM 40 is greater than the capacity of the SCM 50. Therefore, the DRAM 40 may be used as a main memory, and the SCM 50 may be used as an auxiliary memory. In this way, a large amount of data is stored in the DRAM 40, and only a small amount of data is stored in the SCM 50.

A person skilled in the art may know that, currently, DRAM chips are almost all manufactured in accordance with the standard-specified refresh cycle of 64 ms. A refresh cycle is related to a retention time of each memory cell (for example, DRAM cell) in a DRAM chip. The retention time refers to time that a memory cell keeps data. Once exceeding the retention time, data stored in the memory cell is lost. To prevent data stored in a DRAM chip from being lost, the DRAM chip needs to be refreshed according to the refresh cycle. However, it is found in an actual application that, because a retention time of each memory cell (for example, DRAM cell) in a DRAM chip fluctuates, 64 ms is actually a poorest retention time of a memory cell. Therefore, in this embodiment of the present disclosure, system power consumption and a delay time that are caused by DRAM refresh may be reduced by lengthening a refresh cycle. However, simply lengthening the refresh cycle of the DRAM chip may cause an error to data.

To ensure correctness of data while reducing system power consumption, in the computer system architecture shown in this embodiment of the present disclosure, the memory 30 may further include a content addressable memory (CAM) 60. The CAM 60 is a dedicated storage device, and is capable of performing many parallel searches quickly. The CAM 60 may be composed of a non-volatile storage device, so that the CAM 60 is non-volatile. Certainly, it can be understood that the CAM 60 may also be composed of a volatile storage device, which is not limited herein. In this embodiment of the present disclosure, an example in which the CAM 60 is composed of a non-volatile storage device is used for description. The CAM 60 may store a mapping relationship between an unqualified DRAM 40 address and an SCM 50 address. The unqualified DRAM address refers to an address of a memory cell (for example, DRAM cell) that is in the DRAM 40 and whose retention time is shorter than the refresh cycle. There may be multiple unqualified DRAM addresses. In this embodiment of the present disclosure, an address of a memory cell whose retention time is short may be mapped to the SCM 50, so that access to the memory cell whose retention time is short is converted to access to the SCM 50 to ensure correctness of data. It can be understood that, if the CAM 60 is composed of a volatile storage device, the mapping relationship between an unqualified DRAM 40 address and a SCM 50 address may be prestored in an external memory. When the system is powered on, the mapping relationship between the unqualified DRAM 40 address and the SCM 50 address may be obtained from the external memory, and the mapping relationship is written to the CAM 60.

Because this embodiment of the present disclosure is applied to a computer system architecture based on a hybrid memory, the memory 30 may further include a multiplexer (MUX) 70. The MUX 70 may select, under control of a selection signal, one line of data from multiple lines of data as an output signal. In this embodiment of the present disclosure, an input end of the MUX 70 is connected to both the DRAM 40 and the SCM 50, and an output end of the MUX 70 is connected to the memory controller 20. When data needs to be read from the memory 30, the MUX 70 may select to output data stored in the DRAM 40 to the memory controller 20, or output data stored in the SCM 50 to the memory controller 20. For example, the MUX 70 may include a buffer used for buffering data output from the DRAM 40, and a buffer used for buffering data output from the SCM 50.

It should be noted that a specific location of the CAM 60 is not limited in this embodiment of the present disclosure. For example, in one case, in the computer systems shown in FIG. 1-A and FIG. 1-C, the CAM 60 may be located in the SCM 50 and used as a component of the SCM 50. In another case, in the computer system shown in FIG. 1-B, the CAM 60 may be a storage component independent of the SCM 50. In addition, a connection relationship between the CAM 60 and another component is not limited in this embodiment of the present disclosure. For example, in one case, as shown in FIG. 1-A and FIG. 1-B, the CAM 60 may be connected to all of the memory controller 20, the SCM controller 52, and the multiplexer 70. In another case, as shown in FIG. 1-C, the CAM 60 may alternatively be connected to only the SCM controller 52 and the MUX 70.

In an actual application, in one case, as shown in FIG. 1-A and FIG. 1-C, the SCM controller 52, the storage module 54, and the CAM 60 may be integrated in one chip. In another case, as shown in FIG. 1-B, the CAM 60 may be an independent chip, and the SCM controller 52 and the storage module 54 may be integrated in one chip. In still another case, the CAM 60 and the SCM controller 52 may be integrated in one chip, and the storage module 54 may be an independent chip. Hardware forms of the CAM 60, the SCM controller 52, and the storage module 54 are not limited in this embodiment of the present disclosure. In addition, the SCM controller 52, the storage module 54, the CAM 60, and the MUX 70 may also be integrated as one chip to constitute, together with the DRAM 40, a DIMM. Hardware forms of the DRAM 40, the CAM 60, the SCM 50, and the MUX 70 are not limited in this embodiment of the present disclosure either.

In the computer system architectures shown in FIG. 1-A to FIG. 1-C according to this embodiment of the present disclosure, to ensure correctness of data while reducing system costs and system power consumption, the memory controller 20 may mainly access the DRAM 40, and the SCM controller 52 performs an access operation according to an access instruction of the memory controller 20 only when the CAM 60 determines that access to the SCM 50 is needed. In other words, when access to the memory 30 is needed, the SCM 50 does not execute every access instruction delivered by the memory controller 20 but executes an access instruction delivered by the memory controller 20 according to a signal output by the CAM 60 only when the CAM 60 determines that access to the SCM 50 is needed.

In should be noted that, in the computer system provided in this embodiment of the present disclosure, in addition to the components shown in FIG. 1-A, FIG. 1-B, and FIG. 1-C, the computer system 100 may further include other components such as a communications interface and a magnetic disk used as an external memory, which is not limited herein. Based on the foregoing descriptions about the computer system architectures based on a hybrid memory according to this embodiment of the present disclosure, the following describes a memory access method provided in the embodiments of the present disclosure in detail. Because the computer system architectures shown in FIG. 1-A, FIG. 1-B, and FIG. 1-C are similar, for ease of description, the following describes the memory access method provided in the embodiments of the present disclosure in detail, by mainly referring to the computer system architecture shown in FIG. 1-A.

FIG. 2 is a flowchart of a memory access method according to an embodiment of the present disclosure. The method may be applied to the computer system 100 shown in FIG. 1-A. The method may be executed by the SCM 50 in FIG. 1-A. Specifically, the method may be executed by the SCM controller 52 in the SCM 50. As shown in FIG. 2, the method may include the following steps.

In step 200, the SCM controller 52 receives a first access instruction sent by the memory controller 20, where the first access instruction includes a first address. The first access instruction is used for accessing the memory 30, and the first address is used to point to a to-be-accessed memory cell set of the DRAM 40. A person skilled in the art may know that, when the CPU 10 needs to access the memory, a logical address may be translated to a physical address of the memory using the MMU in the CPU 10. The memory controller 20 may address the memory 30 according to the physical address resulting from the translation by the MMU, so as to obtain data stored in the memory 30 or write data to the memory 30. In the computer system architecture shown in FIG. 1-A according to the embodiments of the present disclosure, because a capacity of the DRAM 40 is greater than a capacity of the SCM 50, the DRAM 40 may be used as a main memory and the SCM 50 may be used as an auxiliary memory. When the memory controller 20 is to access the memory 30, the memory controller 20 may send an access instruction to the DRAM 40 and the SCM 50. In this way, all addresses carried in the access instruction sent by the CPU 10 to the memory controller 20 may be an address that points to a physical space provided by the DRAM 40. In this embodiment of the present disclosure, the first address may point to a physical space provided by multiple to-be-accessed memory cell sets in the DRAM 40.

As described above, DRAM cells in the DRAM 40 are arranged and distributed into a matrix, and the matrix is referred to as a DRAM bank. When access to the memory 30 is needed, the memory controller 20 may locate any DRAM cell in the DRAM bank according to the first address using corresponding row and column decoders. It should be noted that the first address may be one address, or may be an address range. For example, when the memory access instruction is a write instruction, the first address may be a start address of to-be-written data. When the memory access instruction is a read instruction, the first address may include a start address to be accessed and a size of an address space to be accessed. In this embodiment of the present disclosure, granularity of a storage space that is of the memory and to which the first address points may be a byte, or a line, or a page. In this way, the storage space that is of the memory and to which the first address points may include at least one byte, or include at least one line, or include at least one page. The memory cell set to which the first address points may include one memory cell, or may include multiple memory cells, which is not limited herein.

In step 205, the SCM controller 52 determines that the memory cell set that is of the DRAM 40 and to which the first address points includes a memory cell whose retention time is shorter than a refresh cycle of the DRAM. The refresh cycle of the DRAM is longer than a standard refresh cycle. In this embodiment of the present disclosure, the DRAM 40 is used as the main memory. Moreover, it is found during technology research that retention times of most DRAM cells in the DRAM 40 are longer than the standard refresh cycle of a DRAM. Therefore, to reduce static power consumption of the DRAM 40, a quantity of times that the DRAM 40 is refreshed may be decreased by lengthening a refresh cycle of the DRAM 40. In the prior art, the standard refresh cycle of a DRAM specified by the Joint Electron Device Engineering Council (JEDEC) is 64 ms, and DRAMs are manufactured in accordance with the standard refresh cycle. In this embodiment of the present disclosure, a new refresh cycle may be specified for the DRAM 40 to decrease the quantity of times that the DRAM 40 is refreshed. The specified refresh cycle for the DRAM 40 is longer than the standard-specified standard refresh cycle of a DRAM. For example, if the standard refresh cycle is 64 ms, the refresh cycle of the DRAM 40 specified in this embodiment of the present disclosure may be 128 ms or 256 ms. It can be understood that, with development of technologies, the standard refresh cycle of a DRAM may alternatively be longer than the presently specified 64 ms. In this case, the refresh cycle of the DRAM 40 specified in this embodiment of the present disclosure may also be longer. The specified refresh cycle of the DRAM 40 is not specifically limited herein, provided that the specified refresh cycle of the DRAM 40 is longer than the standard-specified refresh cycle of a DRAM.

It can be understood that, in this embodiment of the present disclosure, because the refresh cycle of the DRAM 40 is lengthened, the memory cell (cell) that is in the DRAM 40 and whose retention time is shorter than the specified refresh cycle of the DRAM 40 may suffer data loss as a result. Therefore, in this embodiment of the present disclosure, the memory cell that is in the DRAM 40 and whose retention time is shorter than the specified refresh cycle of the DRAM may be detected in advance, and an address of the memory cell that is in the DRAM 40 and whose retention time is shorter than the specified refresh cycle of the DRAM is stored in the CAM 60 shown in FIG. 1-A to FIG. 1-C. Therefore, in step 205, the SCM controller 52 may specifically determine, using the CAM 60, whether the first memory cell set that is of the DRAM 40 and to which the first address points includes a memory cell whose retention time is shorter than the specified refresh cycle of the DRAM. For example, the CAM 60 queries whether a data item stored in the CAM 60 includes the first address, and if a data item stored in the CAM 60 includes the first address, it indicates that the first address hits the CAM 60, and that the first memory cell set that is of the DRAM 40 and to which the first address points includes a memory cell whose retention time is shorter than the specified refresh cycle of the DRAM.

In an actual application, in one case, in the computer system architectures shown in FIG. 1-A and FIG. 1-B, the CAM 60 is connected to both the memory controller 20 and the SCM controller 52. When the memory controller 20 sends the first access instruction to the DRAM 40 and the SCM 50, the memory controller 20 may simultaneously send the first address in the first access instruction to the CAM 60. The CAM 60 compares the first address input by the memory controller 20 with the data items stored in the CAM 60. When it is determined that a data item stored in the CAM 60 includes the first address, the CAM 60 may output, to the SCM 52, a second address that has a mapping relationship with the first address and that is stored in the CAM 60. In still another case, in the computer system architecture shown in FIG. 1-C, the CAM 60 is not directly connected to the memory controller 20. When the SCM controller 52 receives the first access instruction sent by the memory controller 20, the SCM controller 52 may send the first address carried in the first access instruction to the CAM 60, so as to query whether the CAM 60 stores a data item that includes the first address. If the CAM 60 determines that a data item stored in the CAM 60 includes the first address, the CAM 60 may output, to the SCM 52, a second address that has a mapping relationship with the first address and that is stored in the CAM 60.

In an actual application, when the CAM 60 determines that a data item stored in the CAM 60 includes the first address, the CAM 60 may further send a first instruction signal to the MUX 70. The first instruction signal is used to instruct the MUX 70 to wait for the SCM 50 to output data. It can be understood that, if the first access instruction is a read instruction, the MUX 70 may output, according to the first instruction signal sent by the CAM 60, data stored in the SCM 50 to the memory controller 20. If the first access instruction is a write instruction, the MUX 70 may not output data to the memory controller 20 when data is not received in a preset time.

Further, a speed at which a DRAM reads data is higher than a speed at which an SCM performs a read operation, and in this embodiment of the present disclosure, the DRAM 40 is used as the main memory, and a time sequence for a memory access instruction may be determined according to an access time limit for the DRAM. Therefore, if the first access instruction is a read instruction, to ensure correctness of data, when the CAM 60 determines, according to the first address, that the memory cell set that is of the DRAM 40 and to which the first address points includes a memory cell whose retention time is shorter than the refresh cycle of the DRAM, the CAM 60 may further send a hold instruction to the memory controller 20. The hold instruction is used to instruct the memory controller 20 to hold a preset waiting time to wait to receive data output by the SCM 50. It can be understood that, in the computer system architectures shown in FIG. 1-A and FIG. 1-B, the CAM 60 may directly send the hold instruction to the memory controller 20. In the computer system architecture shown in FIG. 1-C, the CAM 60 may send the hold instruction to the memory controller 20 using the SCM controller 52; or the SCM controller 52 sends the hold instruction to the memory controller in an active manner when the SCM controller 52 receives the second address sent by the CAM 60, which is not limited herein.

It can be understood that, in an actual application, the first address may be some addresses in a to-be-accessed address range in the first access instruction. The first access instruction may further include an address that is other than the first address and that does not point to a memory cell whose retention time is shorter than the specified refresh cycle of the DRAM.

In step 210, the SCM controller 52 obtains the second address having a mapping relationship with the first address. The second address is used to point to a second memory cell set of the SCM 50. As described above, in this embodiment of the present disclosure, the address of the memory cell that is in the DRAM 40 and whose retention time is shorter than the specified refresh cycle of the DRAM may be prestored in the CAM 60. Because a memory cell whose retention time is shorter than the specified refresh cycle of the DRAM causes data loss, to ensure correctness and completeness of data stored in the memory 30, in this embodiment of the present disclosure, a physical space provided by a memory cell that is in the DRAM 40 and whose retention time is shorter than the specified refresh cycle of the DRAM may be mapped to a physical space provided in the SCM 50. In other words, a memory cell in the SCM 50 is used as a backup memory cell of the memory cell that is in the DRAM 40 and whose retention time is shorter than the specified refresh cycle of the DRAM. In this way, data that needs to be written to the memory cell that is in the DRAM 40 and whose retention time is shorter than the specified refresh cycle of the DRAM may be also written to the memory cell in the SCM 50, to prevent loss of this part of data.

Specifically, a mapping relationship between an address of the detected memory cell that is in the DRAM 40 and whose retention time is shorter than the specified refresh cycle of the DRAM and an address in the SCM 50 may be established. An address in the DRAM 40 and an address in the SCM 50 that have a mutual mapping relationship are used to store same data. In an actual application, during a system initialization process, the address of the detected memory cell that is in the DRAM 40 and whose retention time is shorter than the specified refresh cycle of the DRAM may be written to the CAM 60, and the mapping relationship between the address of the detected memory cell that is in the DRAM 40 and whose retention time is shorter than the specified refresh cycle of the DRAM and the address of the memory cell in the SCM 50 may be stored in the CAM 60. For ease of description, in this embodiment of the present disclosure, an address of a memory cell whose retention time is shorter than the specified refresh cycle of the DRAM is referred to as an unqualified DRAM address. In this embodiment of the present disclosure, a mapping relationship between an unqualified DRAM address and an SCM address may be stored in the CAM 60. For example, the mapping relationship between an unqualified DRAM address and an SCM address may be shown in Table 1:

TABLE 1

| Unqualified DRAM address | SCM address |
|---|---|
| ADDR0 | SCM_ADDR0 |
| ADDR1 | SCM_ADDR1 |
| ADDR2 | SCM_ADDR2 |
| ADDR3 | SCM_ADDR3 |
| . . . | . . . |

In Table 1, an unqualified DRAM address is used to indicate an address of a memory cell that is in the DRAM 40 and whose retention time is shorter than the specified refresh cycle of the DRAM. An SCM address is used to indicate an address that has a mapping relationship with an unqualified DRAM address and that points to a physical space in the SCM 50. As shown in Table 1, ADDR0 and SCM_ADDR0 are a pair of addresses having a mapping relationship. ADDR0 and SCM_ADDR0 are used to store same data. By analogy, ADDR1 and SCM_ADDR1 also have a mapping relationship and are used to store same data. No further description is provided herein. In this embodiment of the present disclosure, the unqualified DRAM address may be an address of at least one byte. The unqualified DRAM address may alternatively be an address range. The address range may include one line or more lines of addresses, inclusive of the address of the memory cell whose retention time is shorter than the specified refresh cycle of the DRAM. Certainly, the unqualified address of a DRAM may alternatively point to one page or multiple pages, which is not limited herein.

In this step, the CAM 60 may determine, according to the foregoing Table 1, whether the first address is an unqualified DRAM address. If the first address is an unqualified DRAM address, it may be further determined, according to Table 1, a second address having a mapping relationship with the first address. The second address is an address of a memory cell in the second memory cell set of the SCM 50. In the embodiment shown in FIG. 2, an example in which the first address is an unqualified DRAM address is used. For example, the first address is ADDR1 in Table 1, the CAM 60 may output, to the SCM controller 52, a second address having a mapping relationship with the first address, that is, SCM_ADDR1.

In this embodiment of the present disclosure, to ensure correctness of data, the memory cell in the first memory cell set that is of the DRAM and to which the first address points and the memory cell in the second memory cell set that is of the SCM and to which the second address points are configured to store same data. In addition, a total storage capacity of the memory cell in the second memory cell set is not less than a total storage capacity of the memory cell in the first memory cell set. For example, the total storage capacity of the memory cell in the first memory cell set may be 1 kB (Byte). Then, the total storage capacity of the memory cell in the second memory cell set is not less than 1 kB.

It should be noted that, an unqualified DRAM address stored in the CAM 60 may be detected according to a lengthened refresh cycle when the DRAM leaves the factory. For one DRAM, an unqualified DRAM address is definite. During a system initialization process, an SCM address having a mapping relationship with the unqualified DRAM address may be adjusted. In other words, the mapping relationship in the foregoing Table 1 is not fixed. For example, after the mapping relationship is adjusted, a mapping relationship between SCM_ADDR3 and ADDRA0 may be established, which is not limited herein.

In step 215, the SCM controller 52 converts the first access instruction into a second access instruction according to the second address. The second access instruction includes the second address. Specifically, after receiving the first access instruction sent by the memory controller 20, the SCM controller 52 may buffer the first access instruction first, and after receiving the second address output by the CAM 60, the SCM controller 52 may substitute the second address for the first address as a to-be-accessed address in the first access instruction, so that the first access instruction can be converted into the second access instruction. A to-be-accessed address carried in the second access instruction is the second address. For example, the first access instruction is read (ADDR1, 1 kB), and a second access instruction resulting from the conversion is read (SCM_ADDR1, 1 kB). The ADDR1 is used to indicate the to-be-accessed first address, SCM_ADDR1 is used to indicate the second address, and 1 kB is used to indicate a size of data to be read.

In step 220, the SCM controller 52 accesses the memory cells in the second memory cell set according to the second access instruction. For example, if the memory access instruction is an instruction for writing data, the memory controller 20 may write, according to the second address, data to the memory cells in the second memory cell set that is of the SCM 50 and to which the second address points. If the memory access instruction is an instruction for reading data, the memory controller 20 may read data from the memory cells in the second memory cell set that is of the SCM 50 and to which the second address points.

In the memory access method provided in this embodiment of the present disclosure, the refresh cycle of the DRAM 40 is longer than the standard-specified refresh cycle, and the mapping relationship between an address of a memory cell whose retention time is shorter than the refresh cycle of the DRAM 40 and an address of a memory cell in the SCM 50 is pre-established in the CAM 60. Therefore, when determining that an access instruction includes access to an unqualified DRAM memory cell (i.e. DRAM cell), the SCM controller 52 may convert the access to the DRAM to access to the SCM 50. With the method provided in this embodiment of the present disclosure, correctness of data can be ensured while power consumption for DRAM refresh is reduced.

In addition, in the memory access method provided in this embodiment of the present disclosure, the DRAM 40 is used as the main memory for accessing. Therefore, the DRAM 40 executes every instruction delivered by the memory controller 20. In this way, during a process in which the SCM controller 52 accesses the SCM 50 according to the access instruction delivered by the memory controller, the DRAM 40 also executes the access instruction. The memory cell that is in the DRAM 40 and whose retention time is shorter than the refresh cycle of the DRAM 40 is only a small part of all memory cells in the DRAM 40. Therefore, with the method shown in this embodiment of the present disclosure, the SCM controller 52 performs access operations on the SCM 50 for only some instructions according to the method shown in FIG. 2. In addition, because read and write speeds of the DRAM 40 are relatively high, the method shown in this embodiment of the present disclosure can reduce system costs without lowering a system access speed, and can also ensure the system access speed while reducing system power consumption.

Figure 3:
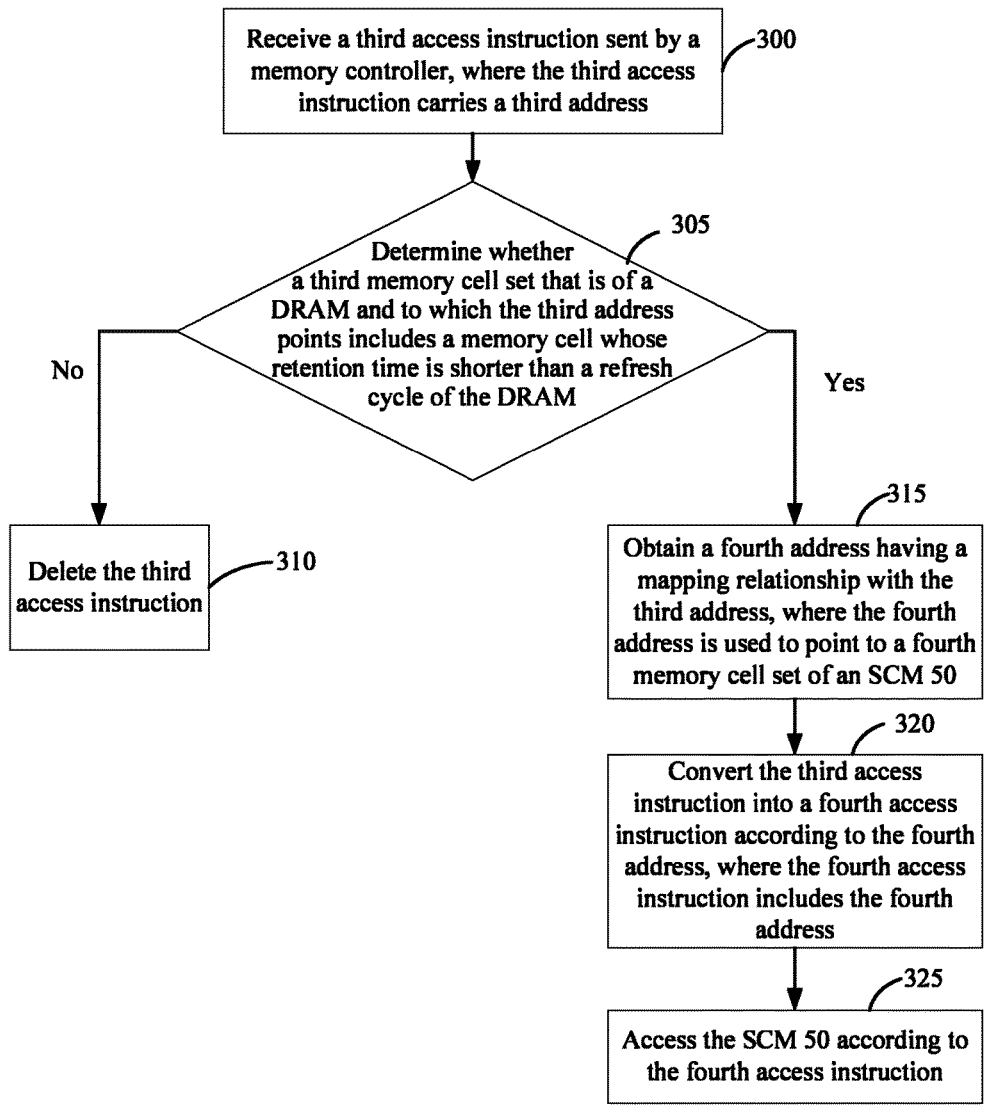
FIG. 3 is a schematic flowchart of a memory access method according to an embodiment of the present disclosure.

FIG. 3 is a flowchart of a method according to an embodiment of the present disclosure. The method may still be applied to the computer system 100 shown in FIG. 1-A to FIG. 1-C. The following describes, by mainly referring to FIG. 1-A, a memory access method shown in FIG. 3 in detail. The method may be executed by the SCM 50 in FIG. 1-A. Specifically, the method may be executed by the SCM controller 52 in the SCM 50. As shown in FIG. 3, the method may include the following steps.

In step 300, the SCM controller 52 receives a third access instruction sent by the memory controller. The third access instruction carries a third address, and the third address is used to point to a to-be accessed third memory cell set of the DRAM. In an actual application, the memory controller 20 may send the third access instruction to the DRAM 40 and the SCM 50 simultaneously. In the system architectures shown in the embodiments of the present disclosure, the DRAM 40 is used as a main memory. Therefore, the DRAM 40 needs to execute all access instructions delivered by the memory controller, then the third address in the third instruction is an address pointing to a memory cell in the DRAM 40. Step 300 is similar to step 200 shown in FIG. 2, and for details, refer to the description of step 200, and no further description is provided herein.

In step 305, the SCM controller 52 determines whether the third memory cell set includes a memory cell whose retention time is shorter than a refresh cycle of the DRAM. The refresh cycle of the DRAM is longer than a standard refresh cycle. If the SCM controller 52 determines that the third memory cell set does not include a memory cell whose retention time is shorter than the refresh cycle of the DRAM, the method proceeds to step 310; and otherwise, the method proceeds to step 315. Specifically, the SCM controller 52 may determine, using the CAM 60, whether the third memory cell set includes a memory cell whose retention time is shorter than the refresh cycle of the DRAM. If the third address hits the CAM 60, the CAM 60 outputs, to the SCM controller 52, a fourth address having a mapping relationship with the third address, which indicates that the third memory cell set includes a memory cell whose retention time is shorter than the refresh cycle of the DRAM. If the third address does not hit the CAM 60, it indicates that the third memory cell set does not include a memory cell whose retention time is shorter than the refresh cycle of the DRAM. Step 305 is similar to step 205 shown in FIG. 2, and for details, refer to description of step 205. No further description is provided herein.

In step 310, the SCM controller 52 deletes the third access instruction. In an actual application, after receiving the third access instruction sent by the memory controller 20, the SCM controller 52 does not execute the third access instruction immediately, but buffers the third access instruction first. Therefore, in step 305, if the SCM controller 52 does not receive the fourth address sent by the CAM 60, it indicates that the SCM controller 52 determines, using the CAM 60, that the third memory cell set to which the third address in the third access instruction points does not include a memory cell whose retention time is shorter than the refresh cycle of the DRAM. In this case, the SCM controller 52 may delete the third access instruction, and does not access the SCM according to the third access instruction.

In step 315, the SCM controller 52 obtains the fourth address having a mapping relationship with the third address. The fourth address is used to point to a fourth memory cell set of the SCM 50. In step 320, the SCM controller 52 converts the third access instruction into a fourth access instruction according to the fourth address. The fourth access instruction includes the fourth address. In step 325, the SCM controller 52 accesses the SCM 50 according to the fourth access instruction. Specifically, the SCM controller 52 accesses a memory cell in the fourth memory cell set in the SCM 50 according to the fourth access instruction. It can be understood that, step 315 to step 325 are similar to step 210 to step 220 shown in FIG. 2 respectively, and for details, respective refer to description of the related steps in the embodiment shown in FIG. 2. No further description is provided herein.

An embodiment of the present disclosure further provides a computer program product for data processing, including a computer readable storage medium that stores program code, where an instruction included in the program code is used to execute the method process described in any one of the foregoing method embodiments. A person of ordinary skill in the art may understand that the foregoing storage medium may include any non-transitory machine-readable medium capable of storing program code, such as a USB flash drive, a removable hard disk, a magnetic disk, an optical disc, a random-access memory (RAM), a solid state disk (SSD), or a non-volatile memory.

It should be noted that the embodiments provided by this application are merely exemplary. A person skilled in the art may clearly know that, for convenience and conciseness of description, in the foregoing embodiments, the embodiments are described with different emphases, and for a part not described in detail in one embodiment, refer to a relevant description of another embodiment. Features disclosed in the embodiments of the present disclosure, claims, and the accompanying drawings may exist independently, or exist in a combination. Features described in a hardware form in the embodiments of the present disclosure may be executed by software, and vice versa, which is not limited herein.

What is claimed is:

1. A computer system, wherein the computer system comprises a memory controller and a hybrid memory, wherein the hybrid memory comprises a dynamic random access memory (DRAM) and a storage-class memory (SCM), wherein
   the memory controller is configured to send a first access instruction to the DRAM and the SCM, wherein the first access instruction carries a first address addressing a first memory cell set of the DRAM;
   the DRAM is configured to access a memory cell in the first memory cell set according to the first access instruction; and
   the SCM is configured to:
   receive the first access instruction sent by the memory controller;
   determine that the first memory cell set comprises a memory cell with retention time shorter than a refresh cycle of the DRAM, wherein the refresh cycle of the DRAM is longer than a standard refresh cycle;
   obtain a second address addressing a second memory cell set of the SCM, the second address having a mapping relationship with the first address;
   convert the first access instruction into a second access instruction according to the second address, wherein the second access instruction comprises the second address; and
   access a memory cell in the second memory cell set according to the second access instruction.

2. The computer system according to claim 1, wherein the first address is stored in a content addressable memory (CAM), wherein the first memory cell set comprising the memory cell with retention time shorter than the refresh cycle of the DRAM is determined according to the first address, wherein the CAM stores one or more addresses of one or more memory cells in the DRAM, the one or more memory cells having retention time shorter than the refresh cycle of the DRAM, the one or more addresses including the first address, wherein the mapping relationship is stored in the CAM, wherein the second address is obtained according to the first address and the mapping relationship, wherein the memory cell in the first memory cell set of the DRAM and the memory cell in the second memory cell set of the SCM are configured to store same data.

3. The computer system according to claim 1, wherein:
   the memory controller is further configured to send a third access instruction to the DRAM and the SCM, wherein the third access instruction carries a third address addressing a third memory cell set of the DRAM;
   the DRAM is further configured to access a memory cell in the third memory cell set according to the third access instruction; and
   the SCM is further configured to:
   receive the third access instruction sent by the memory controller; and
   delete the third access instruction when the third memory cell set does not comprise a memory cell whose retention time is shorter than the refresh cycle of the DRAM.

4. The computer system according to claim 3, wherein the hybrid memory further comprises:
   a multiplexer MUX, configured to: output, to the memory controller, data stored in the memory cell in the second memory cell set of the SCM when the first access instruction is a read instruction.

5. The computer system according to claim 4, wherein the multiplexer MUX is further configured to:
   output, to the memory controller, data stored in the memory cell in the third memory cell set of the DRAM when the third access instruction is a read instruction.

6. The computer system according to claim 1, wherein a total storage capacity of the memory cell in the second memory cell set is not less than a total storage capacity of the memory cell in the first memory cell set.

7. A storage-class memory (SCM) in a hybrid memory of a computer system, wherein the hybrid memory comprises a dynamic random access memory (DRAM) having a refresh cycle longer than a standard refresh cycle, and wherein the SCM comprises:
   an SCM controller, configured to
   receive a first access instruction sent by a memory controller of the computer system, wherein the first access instruction carries a first address addressing a first memory cell set of the DRAM, and
   convert the first access instruction into a second access instruction according to a second address having a mapping relationship with the first address when the first memory cell set comprises a memory cell whose retention time is shorter than the refresh cycle of the DRAM, wherein the second address addressing a second memory cell set of the SCM, and access a memory cell in the second memory cell set of the SCM according to the second access instruction, wherein the second access instruction comprises the second address;
a content addressable memory (CAM), configured to obtain the second address.

8. The SCM according to claim 7, wherein the first address is prestored in the CAM, wherein one or more addresses addressing one or more memory cells in the DRAM, the one or more memory cells having retention time shorter than the refresh cycle of the DRAM, the one or more addresses including the first address, wherein the second address is obtained according to the first address and the mapping relationship, and wherein the CAM is further configured to:
determine, according to the first address, that the first memory cell set comprises a memory cell whose retention time is shorter than the refresh cycle of the DRAM, wherein a memory cell in the first memory cell set addressed by the first address in the DRAM and the memory cell in the second memory cell set addressed by the second address in SCM are configured to store same data.

9. The SCM according to claim 7, wherein:
the SCM controller is further configured to receive a third access instruction sent by the memory controller, wherein the third access instruction carries a third address addressing a third memory cell set of the DRAM;
the CAM is further configured to determine, according to the third address, that the third memory cell set does not comprise a memory cell whose retention time is shorter than the refresh cycle of the DRAM; and
the SCM controller is further configured to delete the third access instruction.

10. The SCM according to claim 7, wherein the hybrid memory further comprises a multiplexer MUX, and the CAM is further configured to:
send a first instruction signal to the MUX in the hybrid memory to instruct the MUX to output data stored in the SCM to the memory controller, wherein the first access instruction is a read instruction, and wherein the first instruction signal is sent after it is determined that the first memory cell set comprises a memory cell whose retention time is shorter than the refresh cycle of the DRAM.

11. The computer system according to claim 7, wherein a total storage capacity of the memory cell in the second memory cell set is not less than a total storage capacity of the memory cell in the first memory cell set.

12. A memory access method for a computer system with a hybrid memory, wherein the hybrid memory comprises a dynamic random access memory (DRAM) and a storage-class memory (SCM), and wherein the method is performed by the SCM and comprises:
receiving a first access instruction sent by a memory controller of the computer system, wherein the first access instruction carries a first address addressing a first memory cell set of the DRAM;
converting the first access instruction into a second access instruction according to a second address having a mapping relationship with the first address, wherein the first memory cell set comprises a memory cell with retention time shorter than the refresh cycle of the DRAM, wherein the refresh cycle of the DRAM is longer than a standard refresh cycle, wherein the second access instruction comprises the second address, and wherein the second address addressing a second memory cell set of the SCM; and
accessing a memory cell in the second memory cell set according to the second access instruction.

13. The method according to claim 12, wherein the first address is stored in a content addressable memory (CAM), wherein the first memory cell set comprising the memory cell with retention time shorter than the refresh cycle of the DRAM is determined according to the first address,
wherein the CAM stores one or more addresses of one or more memory cells in the DRAM, the one or more memory cells having retention time shorter than the refresh cycle of the DRAM, the one or more addresses including the first address.

14. The method according to claim 13, wherein the second address is obtained according to the first address and a mapping relationship between the first address and the second address, wherein the mapping relationship is stored in the CAM, wherein a memory cell in the first memory cell set addressed by the first address in the DRAM and the memory cell in the second memory cell set addressed by the second address in the SCM are configured to store same data.

15. The method according to claim 12, wherein the method further comprises:
receiving a third access instruction sent by the memory controller, wherein the third access instruction carries a third address addressing a third memory cell set of the DRAM, wherein the third memory cell set does not comprise a memory cell whose retention time is shorter than the refresh cycle of the DRAM; and
deleting the third access instruction.

16. The method according to claim 12, wherein the method further comprises:
send a first instruction signal to a multiplexer MUX in the hybrid memory to instruct the MUX to output data stored in the SCM to the memory controller, wherein the first access instruction is a read instruction, and wherein the first instruction signal is sent after it is determined that the first memory cell set comprises a memory cell with retention time shorter than the refresh cycle of the DRAM.

17. The method according to claim 12, wherein a total storage capacity of the memory cell in the second memory cell set is not less than a total storage capacity of the memory cell in the first memory cell set.

* * * * *